(12) United States Patent
Liu et al.

(10) Patent No.: US 11,810,994 B2
(45) Date of Patent: Nov. 7, 2023

(54) INFRARED-TRANSMITTING HIGH-SENSITIVITY VISIBLE LIGHT DETECTOR AND PREPARATION METHOD THEREOF

(71) Applicant: Xi An Technological University, Xi An (CN)

(72) Inventors: Huan Liu, Xi An (CN); Yan An, Xi An (CN); Weiguo Liu, Xi An (CN); Jun Han, Xi An (CN); Changlong Cai, Xi An (CN); Minyu Bai, Xi An (CN); Zhuoman Wang, Xi An (CN)

( * ) Notice: Subject to any disclaimer, the term of this patent is extended or adjusted under 35 U.S.C. 154(b) by 218 days.

(21) Appl. No.: 17/298,021

(22) PCT Filed: Nov. 23, 2019

(86) PCT No.: PCT/CN2019/120447
§ 371 (c)(1),
(2) Date: May 28, 2021

(87) PCT Pub. No.: WO2020/155810
PCT Pub. Date: Aug. 6, 2020

(65) Prior Publication Data
US 2022/0093813 A1    Mar. 24, 2022

(30) Foreign Application Priority Data

Jan. 29, 2019  (CN) .......................... 201910085681.9

(51) Int. Cl.
*H01L 31/109* (2006.01)
*H01L 31/0224* (2006.01)
(Continued)

(52) U.S. Cl.
CPC .... *H01L 31/109* (2013.01); *H01L 31/022408* (2013.01); *H01L 31/1016* (2013.01); *H01L 31/1868* (2013.01)

(58) Field of Classification Search
CPC ........... H01L 31/109; H01L 31/022408; H01L 31/1016; H01L 31/1868; H01L 31/02005; H01L 31/028; H01L 31/032; H01L 31/036

See application file for complete search history.

(56) References Cited

U.S. PATENT DOCUMENTS 9,185,798 B2 * 11/2015 Young ....................... H05K 1/09
10,770,605 B2 * 9/2020 Swelm .................. G01J 5/0853
(Continued)

FOREIGN PATENT DOCUMENTS

CN    104576811 A    4/2015
CN    104919596 A  *  9/2015  ............. B82Y 10/00
(Continued)

*Primary Examiner* — Sitaramarao S Yechuri

(57) ABSTRACT

The invention relates to an infrared-transmitting high-sensitivity visible light detector and its preparation method. The detector is composed of passivation layer (14), upper electrode (13), heterojunction (15), lower electrode (3), and intrinsic monocrystalline silicon substrate (2). The upper electrode (13) is the material that is electrically conductive and transparent to visible light and infrared light. The heterojunction (15) is divided into heterojunction upper layer (5) and heterojunction lower layer (4), wherein the upper heterojunction layer (5) is a nano film sensitive to visible light and capable of transmitting infrared ray, and the lower heterojunction layer (4) is intrinsic monocrystalline silicon. When visible light and infrared light pass through the upper electrode (13) and the heterojunction upper layer (5), the visible light excites electron-hole pairs in the heterojunction (15), which are collected by the upper and lower electrodes and flow out through longitudinally arranged metal columns, while infrared light passes through the whole detection structure, so that visible light can be detected without affecting infrared transmission. The distance between the electrode and the junction zone is very (Continued)

small, which can reduce the recombination rate of electron-hole pairs before reaching the electrode and improve the collection efficiency of photo-generated carriers. The structural design of longitudinal metal reduces light shielding and improves sensitivity.

9 Claims, 2 Drawing Sheets

(51) Int. Cl.
*H01L 31/101* (2006.01)
*H01L 31/18* (2006.01)

(56) References Cited

U.S. PATENT DOCUMENTS

| | | | |
|---|---|---|---|
| 2010/0320391 A1* | 12/2010 | Antonuk | H01L 27/14612 |
| | | | 257/E31.124 |
| 2011/0049566 A1 | 3/2011 | Perera et al. | |
| 2012/0032229 A1* | 2/2012 | Deai | H01L 21/02381 |
| | | | 257/190 |
| 2020/0194602 A1* | 6/2020 | Choi | H01L 31/10 |

FOREIGN PATENT DOCUMENTS

| | | | | |
|---|---|---|---|---|
| CN | 105206689 A | | 12/2015 | |
| CN | 108933183 A | | 12/2018 | |
| CN | 109192865 A | * | 1/2019 | ......... H01L 51/0003 |
| CN | 109742178 A | | 5/2019 | |
| CN | 111180546 A | * | 5/2020 | ..... H01L 31/022408 |

* cited by examiner

INFRARED-TRANSMITTING HIGH-SENSITIVITY VISIBLE LIGHT DETECTOR AND PREPARATION METHOD THEREOF

TECHNICAL FIELD

The invention belongs to the technical field of photoelectric detection, and particularly relates to an infrared-transmitting high-sensitivity visible light detector and preparation method.

BACKGROUND

With the development of industrial technology and living standards, people have put forward higher requirements for the information contained in images. Single infrared imaging or single visible light imaging can no longer meet the demand. Imaging technology with wider wavelength band has attracted more and more attention, especially the technology that can image visible light and infrared at the same time.

Patent CN102866490B proposes a three-band optical imaging system of visible light, medium-wave infrared and long-wave infrared. The optical imaging system can detect visible light, medium-wave infrared and long-wave infrared. However, due to the multi-channel and multi-chip imaging solution, the system is large in size, high in power consumption and heavy in weight, which limits its application scope. Patent CN108336231A discloses an organic photoelectric detection chip with wide spectral response. The photosensitive layer in the detection structure contains a BODIPY organic fluorescent dye, which can realize the spectral detection of ultraviolet to near infrared band. Although the detector can detect visible light and near infrared, it can't detect medium-wave infrared and long-wave infrared, and it is opaque to medium-wave infrared and long-wave infrared, so it can't be vertically stacked and integrated with medium-wave infrared and long-wave infrared.

Because the traditional photoelectric system with multi-channel and multi-chip which can image visible light and infrared light at the same time has the disadvantages of large volume, high power consumption and heavy weight, it is urgent to study photoelectric chips with higher integration, smaller volume and lighter weight, which can image visible light and infrared at the same time.

In addition, visible light-infrared (near-infrared/short-wave infrared/medium-wave infrared/long-wave infrared) imaging detectors usually consist of a substrate, a lower electrode, a photosensitive layer/heterojunction and an upper electrode. Visible light and infrared detection is realized by the same photosensitive layer/heterojunction, resulting in low sensitivity.

SUMMARY

The invention aims to overcome the shortcomings of the above-mentioned existing technical solution, and to provide an infrared-transmitting high-sensitivity visible light detector and preparation method. This structure can detect visible light without affecting the transmission of infrared band. The infrared-transmitting visible light detector of the invention is vertically stacked, mixed and integrated with the infrared detection unit in the later stage, and can realize the detection and imaging of a single integrated chip from visible light to long-wave infrared.

In order to achieve the above purpose, the invention adopts the following technical solution:

An infrared-transmitting high-sensitivity visible light detector comprises an intrinsic monocrystalline silicon substrate, a lower electrode, a heterojunction for detecting visible light, a metal frame, an upper electrode and a passivation layer from bottom to top. The heterojunction includes a heterojunction lower layer and a heterojunction upper layer;

The upper electrode is made of conductive and transparent material to visible light and infrared, which is a grid composed of one-dimensional conductive nanowires; the heterojunction upper layer is a nano-film sensitive to visible light and transparent to infrared; the heterojunction lower layer is intrinsic monocrystalline silicon; the lower electrode is a conductive layer formed by heavily doped ions of intrinsic monocrystalline silicon; below the lower electrode is an intrinsic monocrystalline silicon substrate.

The further improvement of the invention lies in that:

Preferably, the thickness of the lower electrode is 2-20 μm; wherein the heavily doped ions are phosphorus ions, boron ions or arsenic ions.

Preferably, the thickness of the heterojunction lower layer is 1-10 μm.

Preferably, the thickness of the heterojunction upper layer is less than or equal to 5 nm, and the heterojunction upper layer is a nano film composed of two-dimensional materials sensitive to visible light; the two-dimensional material is graphene or two-dimensional transition metal sulfide, and the two-dimensional transition metal sulfide is molybdenum disulfide, tungsten disulfide, molybdenum diselenide or tungsten diselenide.

Preferably, the metal frame is square and annular, and surrounds the upper electrode from all sides; the upper electrode is step-shaped and comprises peripheral steps, a middle bottom and side walls connecting the peripheral steps and the middle bottom, wherein the peripheral steps of the upper electrode are higher than the middle bottom; the upper surface of the metal frame is in contact with the lower surface of the peripheral steps of the upper electrode, the inside of the metal frame is in contact with the side wall of the upper electrode, and the lower surface of the metal frame is in contact with the heterojunction upper layer. The lower surface of the middle bottom of the upper electrode is in contact with the upper surface of the heterojunction upper layer.

Preferably, the one-dimensional conductive nanowires are carbon nanotubes or silver nanowires.

Preferably, the passivation layer is any one of zinc sulfide, zinc selenide or magnesium fluoride.

Preferably, a through hole is formed at one corner of the detection unit from the lower surface of the intrinsic monocrystalline silicon substrate up to the upper surface of the heterojunction upper layer; At the opposite corner of the detection unit, holes are formed from the lower surface of the intrinsic monocrystalline silicon substrate up to the inside of the lower electrode; on the lower surface of the intrinsic monocrystalline silicon substrate, the opening positions of through holes and openings are located at two corners on the same diagonal of the bottom surface of the detection unit; after the side walls of the through holes and openings are passivated, conductive metal is filled in the holes, and the conductive metal is any one of gold, silver, copper or aluminum.

Preferably, the opening at the upper end of the through hole is located at a corner below the metal frame and is in contact with the metal frame; The conductive metals in the through holes and openings protrude from the lower surface of the intrinsic monocrystalline silicon substrate.

A preparation method of the infrared-transmitting high-sensitivity visible light detector comprises the following steps:

Step 1, inject heavily doped ions into an area below 1-10 µm from the upper surface of the intrinsic monocrystalline silicon chip as a lower electrode; the heavily doped ions are phosphorus ions, boron ions or arsenic ions; the thickness of the lower electrode is 2-20 µm; intrinsic monocrystalline silicon above the lower electrode is heterojunction underlayer, and intrinsic monocrystalline silicon below the lower electrode is intrinsic monocrystalline silicon substrate;

Step 2, deposit a nano film sensitive to visible light and transparent to infrared on the upper surface of the heterojunction lower layer by a chemical vapor deposition method to form a heterojunction upper layer; the nano film material is either graphene or two-dimensional transition metal sulfide; the heterojunction upper layer and the heterojunction lower layer together form a heterojunction;

Step 3, etch a through hole from the lower surface of the intrinsic monocrystalline silicon substrate up to the upper surface of the heterojunction upper layer at one corner of the detection unit; etch holes from the lower surface of the intrinsic monocrystalline silicon substrate up to the inside of the lower electrode at the opposite corner of the detection unit; passivate and insulate the side walls of the through holes and openings, and then deposit conductive metals so that the conductive metals of the through holes and openings will protrude from the lower surface of the intrinsic monocrystalline silicon substrate; prepare a square annular metal frame on the upper surface of the heterojunction upper layer, and contact and conduct the metal in the through hole;

Step 4, manufacture an upper electrode on the upper layer of the heterojunction and the upper surface of the metal frame;

Step 5, deposit a passivation layer on the upper electrode, pattern the passivation layer into a probe unit shape by photoetching and etching, and etch the upper electrode, the upper heterojunction layer, the lower heterojunction layer and the lower electrode by using the patterned passivation layer as a masking layer; thus to form an infrared-transmitting high-sensitivity visible light detector capable of transmitting infrared rays.

Compared with the prior art, the invention has the following beneficial effects:

The invention discloses an infrared-transmitting high-sensitivity visible light detector structure, which consists of a passivation layer, an upper electrode, a heterojunction upper layer, a heterojunction lower layer, a lower electrode and an intrinsic monocrystalline silicon substrate. The upper electrode is conductive and transparent from visible light to long-wave infrared. The heterojunction upper layer is composed of nanometer film which can detect visible light and be transparent to infrared. The heterojunction lower layer is intrinsic monocrystalline silicon on the surface of intrinsic monocrystalline silicon chip. The heterojunction lower layer, the lower electrode and the intrinsic monocrystalline silicon substrate are all silicon, which can transmit infrared. When visible light and infrared enter the detection structure, they pass through the transparent upper electrode, pass through the heterojunction upper layer formed by nano film, and reach the heterojunction zone near the interface between the heterojunction upper and lower layers. Photo-generated carriers are generated in the heterojunction zone under the excitation of visible light. In the electric field generated by the upper and lower electrodes, the photo-generated carriers flow out through the upper and lower electrodes to realize the visible light detection function, while infrared continues to pass through the whole detection structure, that is, the visible light detector is infrared-transmitting. Compared with the traditional structure, because of the adoption of nano materials, the distance between the upper and lower electrodes and the junction zone is very small, which can reduce the probability of recombination of electron-hole pairs before reaching the electrodes, and greatly improve the collection efficiency of photo-generated carriers and device sensitivity. Moreover, because of the new material system and structural design, the detection structure can detect visible light with high sensitivity without affecting the transmission of infrared band.

Further, the heterojunction is divided into a heterojunction upper layer and a heterojunction lower layer. Intrinsic monocrystalline silicon on the surface of silicon chip is used as the heterojunction lower layer, with thickness of 1-10 µm.

Furthermore, in the invention, a nano film material which is sensitive to visible light and transparent to infrared is adopted as the heterojunction upper layer, and the thickness of the nano film is ≤5 nm, so that the nano film is transparent to visible light and infrared because of small thickness. Graphene or two-dimensional transition metal sulfide is selected as nano film, and molybdenum disulfide (MoS2), tungsten disulfide (WS2), molybdenum diselenide (MoSe2) and tungsten diselenide (WSe2) are selected as two-dimensional transition metal sulfides with strong light response to visible light. This material can detect visible light within the design film thickness range and has good infrared transmittance. Visible light detection and infrared transmission are realized.

Furthermore, a lower electrode is set below the heterojunction, and a metal frame and an upper electrode are set above the heterojunction. The lower electrode is heavily doped with ions (including phosphorus ions, boron ions or arsenic ions) below the heterojunction lower layer, that is, below the intrinsic zone of the monocrystalline silicon chip to form the lower electrode, and the doping depth range is 2-20 µm. Below the lower electrode is an intrinsic monocrystalline silicon substrate. The metal frame is above the heterojunction upper layer, the upper electrode is above the metal frame and the heterojunction upper layer, and the metal frame is in contact with the lower surface of the upper electrode and the upper surface of the heterojunction upper layer.

Further, the upper electrode is made of conductive material which transmits visible light and infrared, and includes grids formed by one-dimensional conductive nanowire materials (such as carbon nanotubes or silver nanowires) in various forms. The mesh wires of the conductive nanowire grid are conductive and the mesh holes are light-transmitting (infrared and visible light).

Furthermore, a through hole is etched from the lower surface of the intrinsic monocrystalline silicon substrate up to the upper surface of the heterojunction upper layer, passivation and insulation treatment is performed on the side walls of the through hole first, and then conductive metal is deposited, and the conductive metal in the through hole protrudes from the lower end of the intrinsic monocrystalline silicon substrate. The metal frame is in contact with the conductive metal in the through hole, and the electrons in the photo-generated carriers are collected by the metal frame and flow out longitudinally through the metal in the through hole. The lower surface of the intrinsic monocrystalline silicon substrate is etched with holes from up to the inside of the lower electrode. Passivation and insulation treatment are performed on the side walls of the holes, and then conductive metal is deposited. The conductive metal in the holes protrudes from the lower end of the intrinsic monocrystalline silicon substrate, and is in contact with the lower electrode. The holes in the photo-generated carriers are collected by the lower electrode and flow out longitudinally through the metal in the hole. The detection structure converts the incident visible light into corresponding electrical signals, thus realizing the photoelectric detection function. Besides, the conductive columns distributed along the longitudinal direction of the detector hardly block the detection of visible light and are transparent to infrared in the sensitive area.

Furthermore, the passivation layer of the invention is made of insulating and transparent materials for visible light and infrared, such as zinc sulfide, zinc selenide and magnesium fluoride. Passivation layer can protect the upper electrode and the whole detection structure. In the manufacturing process, the patterned passivation layer can replace photoresist as a masking layer for etching the upper electrode, heterojunction and lower electrode, thus reducing the photoetching times.

The invention also discloses a preparation method of the infrared-transmitting high-sensitivity visible light detector, which takes the intrinsic monocrystalline silicon chip as a substrate, and forms a lower electrode through internal heavy doping below a certain area of the surface layer of the intrinsic monocrystalline silicon chip, and the surface layer of the intrinsic monocrystalline silicon chip is still intrinsic monocrystalline silicon as a heterojunction lower layer. A nano film material capable of detecting visible light and transmitting infrared light is deposited on the heterojunction lower layer as the heterojunction upper layer, and the nano film material forms a heterojunction with intrinsic monocrystalline silicon on the surface of the silicon chip. Then, through holes and openings are prepared, passivation and insulation treatment is performed on the side walls of the through holes and openings, then conductive metal is deposited, and a metal frame is prepared. Then, transparent conductive upper electrodes and passivation layers are prepared, and the passivation layers are patterned into the shape of detection units by photoetching and etching methods. The patterned passivation layers are used as masking layers, and the upper electrodes, heterojunction upper layers, heterojunction lower layers and lower electrodes are etched to form detection unit arrays isolated from each other in the horizontal direction.

DETAILED DESCRIPTION

Figure 1:
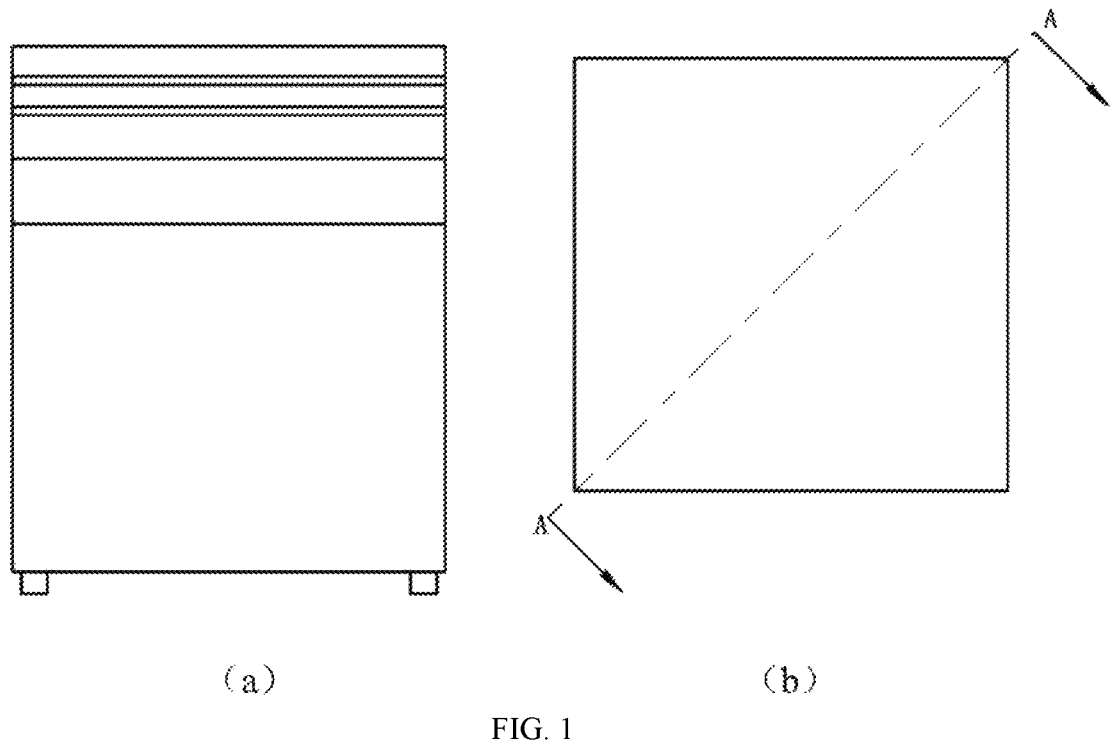
FIG. 1 is a structural diagram of a visible light detector according to the present invention;
Wherein: (a) is a main view, and (b) is a top view.

The invention will be further described in detail as follows with reference to the drawings:

As is shown in FIG. 1, the invention discloses an infrared-transmitting high-sensitivity visible light detector and preparation method. The infrared-transparent high-sensitivity visible light detector comprises a passivation layer 14, an upper electrode 13, a heterojunction 15, a lower electrode 3 and an intrinsic monocrystalline silicon substrate 2 from top to bottom; The heterojunction 15 includes a heterojunction upper layer 5 and a heterojunction lower layer 4;

The lower electrode 3 is silicon with conductivity formed by heavily doped phosphorus, boron, and beryllium plasma below the area 1-10 μm away from the upper surface of the intrinsic monocrystalline silicon chip, and the thickness of the lower electrode 3 is 2-20 μm. The heterojunction lower layer 4 and the intrinsic monocrystalline silicon substrate 2 are both intrinsic monocrystalline silicon.

In the manufacturing process of heterojunction lower layer 4, lower electrode 3 and intrinsic monocrystalline silicon substrate 2, the intrinsic monocrystalline chip 1 is divided into three layers by heavily doped silicon, the upper and lower layers are intrinsic monocrystalline silicon and the middle layer is heavily doped silicon. Heavily doped silicon is used as the lower electrode 3, intrinsic monocrystalline silicon above the heavily doped silicon is used as the heterojunction lower layer 4, and intrinsic monocrystalline silicon below the heavily doped silicon is used as the intrinsic monocrystalline silicon substrate 2. Since silicon can transmit infrared, the lower electrode 3 can transmit infrared while conducting electricity.

Figure 2:
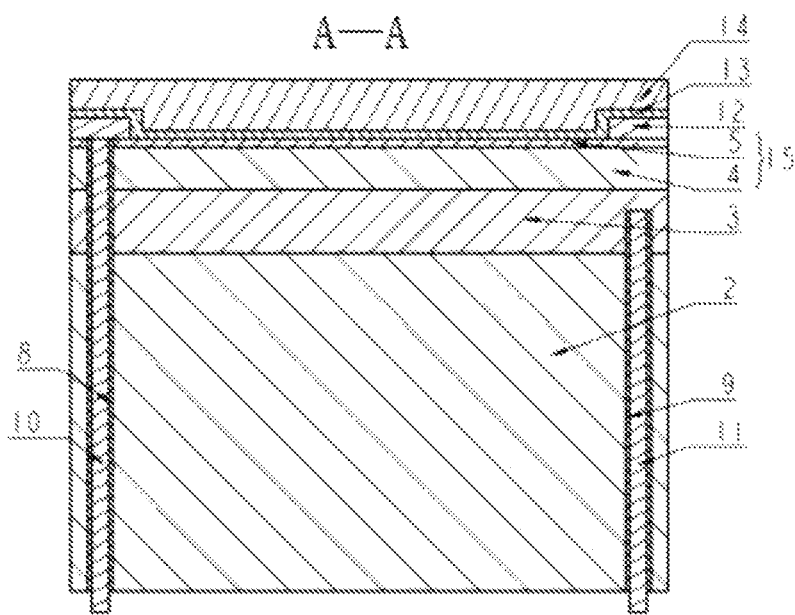
FIG. 2 is a sectional view of the visible light detector of the present invention in direction A-A in FIG. 1 (b)
Figure 3:
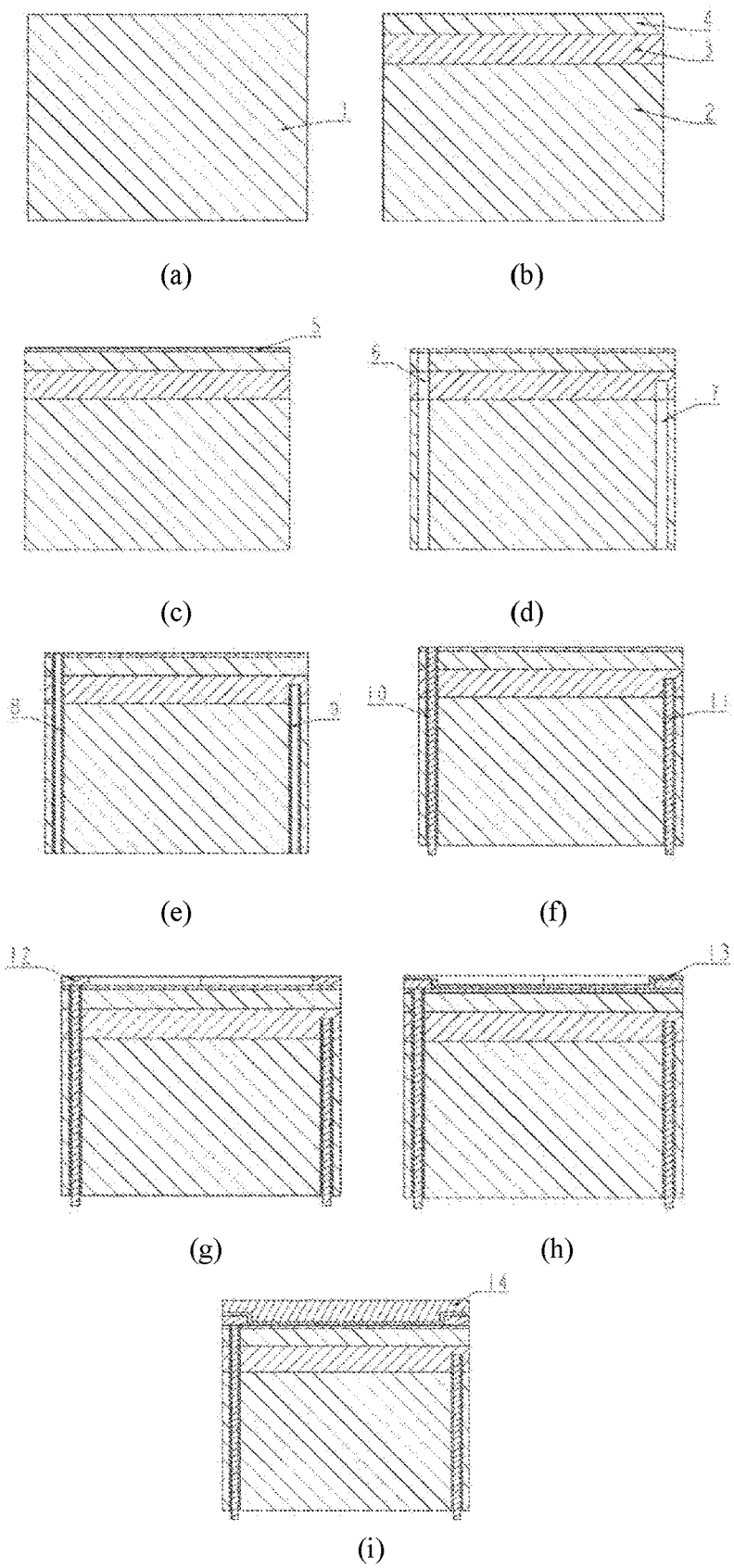
FIG. 3 is a manufacturing flow chart of the visible light detector of the present invention, each of which is a sectional view in direction A-A in FIG. 1 (b);
Wherein: (a) is the device structure diagram of part of the process in step 1;
(b) is the device structure diagram of part of the process in step 1;
(c) is the device structure diagram in step 2;
(d) is the device structure diagram from step 3 to step 5;
(e) is the device structure diagram of part of the process in step 6;
(f) is the device structure diagram of part of the process in step 6;
(g) is the device structural diagram in step 7;
(h) is the device structure diagram in step 8;
(i) is the device structure diagram in step 9;
Wherein: 1—intrinsic monocrystalline silicon chip; 2—intrinsic monocrystalline silicon substrate; 3—lower electrode; 4—heterojunction lower layer; 5—heterojunction upper layer; 6—through hole; 7—opening; 8—insulating layer of through hole; 9—insulating layer of opening; 10—first conductive metal column; 11—second conductive metal column; 12—metal frame; 13—upper electrode; 14—passivation layer.

As is shown in FIG. 2 and FIG. 3 (b), the heterojunction 15 includes two layers: a heterojunction upper layer 5 and a heterojunction lower layer 4, wherein the heterojunction upper layer 5 is a nano film made of two-dimensional materials capable of detecting visible light and transmitting infrared light, and the thickness of the nano film material is ≤5 nm. The nano-film material is graphene or two-dimensional transition metal sulfide, which includes $MoS_2$, $WS_2$, $MoSe_2$, $WSe_2$. Because of its thin thickness, it transmits infrared while detecting visible light. The heterojunction lower layer 4 is intrinsic monocrystalline silicon on the surface layer of the intrinsic monocrystalline silicon chip 1, and has a thickness of 1-10 μm.

As is shown in FIG. 2, the detector structure of the invention is divided into passivation layer 14, upper electrode 13, metal frame 12, heterojunction upper layer 5, heterojunction lower layer 4, lower electrode 3 and intrinsic monocrystalline silicon substrate 2 from top to bottom. The passivation layer 14 is made of an insulating material that transmits visible light and infrared, such as zinc sulfide, zinc selenide and magnesium fluoride. The upper electrode 13 is a conductive material that can transmit visible light and infrared, and has good conductivity, including grids formed by one-dimensional conductive nanowires in various forms, such as carbon nanotube grids and silver nanowire grids. The mesh wires of the conductive nanowire grids are conductive, and the meshes are light-transmitting (visible light and infrared). The metal frame 12 is square and annular, and surrounds the upper electrode 13 from all sides. The upper electrode 13 is stepped, including peripheral steps, a middle bottom, and side walls connecting the peripheral steps and the middle bottom. The upper surface of metal frame 12 is in contact with the lower surface of the peripheral steps of the upper electrode 13, the inside of metal frame 12 is in contact with the side wall of upper electrode 13, the lower surface of metal frame 12 is in contact with heterojunction upper layer 5, the middle bottom of upper electrode 13 is in contact with the upper surface of heterojunction upper layer 5; with the above structure, the upper electrode 13 continuously covers the upper surface of the heterojunction upper layer 5, the side wall of the metal frame 12, and the upper surface. The heterojunction lower layer 4 is intrinsic monocrystalline silicon, and the heterojunction upper layer 5 is a nanometer thin film sensitive to visible light and transparent to infrared, and the heterojunction lower layer 4 and the heterojunction upper layer 5 together form heterojunction 15. The lower part of the heterojunction lower layer 4 is a lower electrode 3, and below of the lower electrode 3 is an intrinsic monocrystalline silicon substrate 2.

It can be seen from the above analysis that the upper electrode 13 is a one-dimensional nano-wire grid and the heterojunction upper layer 5 is a two-dimensional nano-film, so the upper electrode 13 and the heterojunction upper layer 5 can transmit visible light and infrared, while the heterojunction lower layer 4, the lower electrode 3 and the intrinsic monocrystalline silicon substrate 2 are essentially silicon and transparent to infrared, so the whole detector structure can detect visible light without affecting infrared transmission.

As is shown in FIG. 2, at one corner of that detection unit, from the lower surface of the intrinsic monocrystalline silicon substrate 2 up to the upper surface of the heterojunction upper layer 5, the detector is provided with a through hole 6; on the opposite side of the through hole 6 in the detection unit, an opening 7 is formed from the lower surface of the intrinsic monocrystalline silicon substrate 2 up to the inside of the lower electrode 3. The lower end openings of the through hole 6 and the opening 7 are respectively at two ends of a diagonal line of the detection unit on the lower surface of the intrinsic monocrystalline silicon substrate 2. The through hole 6 and the opening 7 are filled with conductive metals, such as gold, silver, copper, aluminum, etc., and the filled conductive metals protrude from the lower surface of the intrinsic monocrystalline silicon substrate 2, wherein the conductive metal in the through hole 6 is the first conductive metal column 10, and the conductive metal in the opening 7 is the second conductive metal column 11. Photo-generated carriers generated by the heterojunction 15 can be led out along the conductive metal column in the through hole 6 and the opening 7 under the effect of the electric field generated by the upper electrode 13 and the lower electrode 3. The conductive metal columns in the through hole 6 are in contact with the metal frame 12, and the conductive metal columns in the through hole 6 and the opening 7 protrude from the lower surface of the intrinsic monocrystalline silicon substrate 2, which are used to interconnect the detector signal with other chips by reverse chip bonding. The electrons generated by heterojunction 15 flow out under the effect of electric field generated by upper electrode 13 and lower electrode 3 and are collected by metal frame 12. The signals collected by metal frame 12 flow out through first conductive metal column 10 in through hole 6, the holes generated by heterojunction 15 are collected by lower electrode 3 and flow out through second conductive metal column 11 in opening 7. In this way, the signals extracted by the conductive metal are distributed along the longitudinal direction of the detector, which can prevent the visible light from reaching the heterojunction interface and the infrared from passing through the whole multilayer detection structure in the sensitive area.

Working Process:

As is shown in FIG. 2, when visible light and infrared enter the detection structure, they pass through the upper electrode 13 which is conductive and transparent to visible light and infrared, and then pass through the heterojunction upper layer 5 which is made of two-dimensional transition metal sulfide, graphene and other nano film materials which can detect visible light and transmit infrared, and reach the heterojunction area near the interface between the heterojunction upper layer 5 and the heterojunction lower layer 4, and the heterojunction 15 generates photo-generated carriers under the excitation of visible light. In the electric field generated by the upper and lower electrodes, the electrons in the photo-generated carriers pass through the heterojunction upper layer 5 and the upper electrode 13, and are collected by the metal frame 12 in contact with the lower surface of the upper electrode 13. The electrons collected by the metal frame 12 flow out through the first conductive metal column 10 in the longitudinally distributed through hole 6, while the holes in the photo-generated carriers are collected by the lower electrode and flow out through the second conductive metal column 11 in the opening 7. The number of photo-generated carriers represents the intensity of incident light, and realizes its photoelectric detection function, while infrared light continues to pass through the whole detection structure, that is, the whole visible light detector can transmit infrared light.

The preparation method of the detector comprises the following steps:

Step 1: Prepare the lower electrode 3

As is shown in FIG. 3 (a), a double-sided polished intrinsic monocrystalline silicon chip 1 with a thickness of 100 μm is taken, phosphorus ions are implanted into the area below 5 μm of the surface layer of the silicon chip, and then rapid thermal annealing (RTA) is performed after implantation, and the implanted ions are activated to form a heavily doped area with a thickness of 10 μm, which is the lower electrode 3, while intrinsic monocrystalline silicon remains above the heavily doped region as the heterojunction lower layer 4, as shown in FIG. 3 (b); at this time, intrinsic monocrystalline silicon chip 1 is divided into heterojunction lower layer 4, lower electrode 3 and intrinsic monocrystalline silicon substrate 2.

Step 2: Prepare the heterojunction upper layer 5

As is shown in FIG. 3 (c), molybdenum disulfide of nano film material is prepared on the surface of the heterojunction lower layer 4 by chemical vapor deposition to form the heterojunction upper layer 5, and the heterojunction upper layer 5 and the heterojunction lower layer 4 form the heterojunction 15. Specific steps: Preparation of substrate cleaning solution; place the silicon chip with conductive deep buried layer prepared in step 1 (including heterojunction lower layer 4, lower electrode 3 and intrinsic monocrystalline silicon substrate 2) in the cleaning solution, heat the cleaning solution to 80° C., hold the temperature for 10 min, take the silicon chip out, immerse it with conductive deep buried layer in acetone solution, ultrasonically clean it for 20 min, flush with deionized water and dry the silicon chip. Take and fill 20 mL of type-C vulcanizing agent into an empty bottle. Put the cleaned silicon chip with deep conductive layer in the bottle for 72 h, take it out and flush with deionized water and dry it. Put the vulcanized silicon chip with conductive deep buried layer as a substrate in a two-zone tubular vacuum atmosphere furnace, and hold the temperature at 400° C. for 1 h under the protection of Ar atmosphere, so as to volatilize excess vulcanizing agent. Then, take and put sulfur powder, MoO3 powder and substrate in three quartz containers respectively. Put the sulfur powder in the radiation zone outside the heating zone in the two-zone tubular vacuum atmosphere furnace, and sublimate it into the heating zone in the furnace after radiant heating. Put the key trioxide and substrate both in the heating zone, and keep the distance between the key trioxide and the substrate at 7 cm. Vacuumize two-zone tubular atmosphere furnace to 8.2 Pa, and feed Ar gas for protection, with flow rate of 800 sccm. The heating zone is divided into a first temperature zone and a second temperature zone. Set first temperature zone to 650° C., raise temperature for 1 h and hold temperature for 20 min, and set second temperature zone to 600° C., raise temperature for 1 h and hold temperature for 20 min. After that, naturally cool to room temperature to form molybdenum disulfide with an average thickness of 3 nm as the heterojunction upper layer 5. At this time, the heterojunction upper layer 5 and the heterojunction lower layer 4 together form the heterojunction 15.

Step 3: Etch the upper half of the through hole 6 on the heterojunction upper layer 5

As is shown in FIG. 3 (*d*), use AZ5214E photoresist and KW-4A mesa spin coater. Drop one or two drops of photoresist to the center of the silicon chip with the heterojunction upper layer 5, and then set rotating speed to 500/15 (rpm/s) at low speed and 4500/50 (rpm/s) at high speed, so that the photoresist is uniformly coated on the heterojunction upper layer 5. Adopt MIRAKTMT The molyne heating plate for pre-drying at 100° C. for 60 s. Expose the photoresist on Q4000 lithography machine. Use KMPPD238-II developing solution to develop the substrate. Etch silicon by reactive ions, set the reaction chamber pressure at 12 mTorr, ICP power at 500 W, oxygen flow rate at 5 sccm, and etching depth at 10 μm, that is, stop etching to the inside of the lower electrode 3, and use acetone to remove photoresist. At this time, a substrate with partial through hole 6 is formed.

Step 4: Preparing metal masking layer for deep silicon etching

Drop three to four drops of photoresist to the back center of the intrinsic monocrystalline silicon substrate 2, and set the rotating speed to coat photoresist uniformly on the silicon chip as a substrate. Adopt MIRAKTMT The molyne heating plate for pre-drying at 100° C. for 60 s. Put the substrate in SUSSMA6 double-sided exposure lithography machine, and expose the photoresist after alignment with the alignment mark of the pattern layer of through hole 6 on the front side. Perform reverse drying for the exposed photoresist, so that the photoresist in the exposure area is under crosslinking reaction and is insoluble in the developing solution. Put the substrate after reverse drying in flood exposure after removing the mask plate in the lithography machine, so that the photoresist in the unexposed area is under photosensitive reaction and can be dissolved in the developing solution. Set the time of flood exposure to 11 s. Use KMPPD238-II developing solution to develop the substrate. Put the developed substrate on a heating plate, set the temperature of the heating plate to 120° C., dry it for 20 min, take it out and cool it naturally to serve as the substrate in the next step. Use JPG560BV magnetron sputtering coating machine, select aluminum target with diameter of 100 mm, thickness of 7 mm and purity of 99.999%, set working gas of 99.99% chlorine gas and vacuum of $5.0 \times 10^{-3}$ Pa. Place the substrate on the substrate holder, close the vacuum chamber door, and vacuumize, when the vacuum degree reaches $10^{-3}$ Pa, the background pressure of the vacuum chamber will reach $5.0 \times 10^{-3}$ Pa. Introduce chlorine gas to make vacuum chamber pressure in working state. Turn on the power supply, and when the glow is stable, begin to deposit aluminum film on the back of the substrate (detector multilayer structure). After deposition for 20 min, turn off chlorine gas, wait for the vacuum chamber to cool to room temperature, then open the vacuum chamber, take out the plated sample, immerse it in acetone solution, and use stripping process to pattern the metal layer.

Step 5: Deeply etch the lower half of the through hole 6 and the opening 7

Etch the lower half of the through hole 6 and the opening 7 by low-temperature reactive ions. Set the substrate temperature at −110° C., when the reaction chamber pressure is 12 Torr, the ICP power is 500 W, and the oxygen flow rate is 5 sccm, start the deep etching of silicon with etching depth of 90 μm, that is, etch into the lower electrode 3 to connect the through hole 6 and etch the opening 7. The etching depth is the same for the two holes, and the opening 7 is a hole from the lower surface of the intrinsic monocrystalline silicon substrate 2 to the inside of the lower electrode 3. Finally, use acetone to remove photoresist and use phosphoric acid to remove aluminum.

Step 6: Prepare metal in the through hole 6 and the opening 7

As is shown in FIG. 3 (*e*), use PECVD is on the lower surface of intrinsic monocrystalline silicon substrate 2, and deposit silicon dioxide in through holes 6 as insulating layer 8 of the through hole, and deposit silicon dioxide in the opening 7 as hole insulating layer 9. And then repeat step 4 and pattern the metal layer by stripping process. That is, coat photoresist, perform exposing and developing, magnetron sputtering for any one of metal aluminum, gold, silver or copper, perform magnetron sputtering of aluminum film in the through hole 6 to form the first conductive metal column 10, and perform magnetron sputtering of aluminum film in the opening 7 to form the second conductive metal column 11. The first conductive metal column 10 and the second conductive metal column 11 are made of the same metal material. When magnetron sputtering aluminum, protrude the aluminum film from the surface of the intrinsic monocrystalline silicon substrate 2 to forming metal column from which the upper and lower electrode signals are led out to interconnect the detector signals with other chips by reverse chip bonding, as shown in FIG. 3 (*f*).

Step 7: Prepare metal frame at the upper end of the through hole 7

As is shown in FIG. 3 (*g*), repeat step 4 on the heterojunction upper layer 5 to pattern the metal layer by stripping process, that is, coat photoresist, perform exposure and developing, perform magnetron sputtering of metal aluminum film, deposit and form a metal frame 12 with a width of 3 μm×3 μm and a thickness of 200 nm on the heterojunction upper layer 5, and then remove the photoresist to form a metal frame 12 connected with the metal 10 in the through hole.

Step 8: Prepare the upper electrode 13 of carbon nanotube grid

As is shown in FIG. 3 (*h*), mix carbon nanotubes and ethanol uniformly in ultrasonic manner to form a suspension, and pour the suspension onto the heterojunction upper layer 5, and after ethanol is volatilized, a carbon nanotube grid is formed to serve as the upper electrode 13.

Step 9: As is shown in FIG. 3 (*i*), prepare a 50 nm zinc sulfide passivation layer 14 by chemical vapor deposition.

Step 10: Etch the upper electrode, heterojunction and lower electrode

Pattern the passivation layer into a detection unit shape by photolithography and etching, use the patterned passivation layer 14 as a masking layer, etch the upper electrode 13, the heterojunction upper layer 5, the heterojunction lower layer 4 and the lower electrode 3 to form an infrared-transmitting high-sensitivity visible light detection unit array isolated from each other in the horizontal direction. Through the above steps, the infrared visible light detector structure is finally formed.

Although the present invention has been illustrated and described herein with reference to preferred embodiments, it should not be construed as limiting the scope of the invention. Any modifications, equivalent substitutions or improvements that are within the spirit and principle of the invention are intended to be covered by the protection scope of the invention.

The invention claimed is:

1. An infrared-transmitting high-sensitivity visible light detector, characterized in that it comprises an intrinsic monocrystalline silicon substrate, a lower electrode, a heterojunction for detecting visible light, a metal frame, an upper electrode and a passivation layer from bottom to top; wherein the heterojunction comprises a heterojunction lower layer and a heterojunction upper layer;
   the upper electrode is made of conductive and transparent material to visible light and infrared, which is a grid composed of one-dimensional conductive nanowires; the heterojunction upper layer is a nano-film sensitive to visible light and transparent to infrared; the heterojunction lower layer is intrinsic monocrystalline silicon; the lower electrode is a conductive layer formed by heavily doped ions of intrinsic monocrystalline silicon; below the lower electrode is an intrinsic monocrystalline silicon substrate;
   characterized in that the metal frame is square and annular and surrounds the upper electrode from all sides; the upper electrode is step-shaped and comprises peripheral step, a middle bottom and side walls connecting the peripheral steps and the middle bottom, wherein the peripheral step of the upper electrode is higher than the middle bottom; the upper surface of the metal frame is in contact with the lower surface of the peripheral step of the upper electrode, the inside of the metal frame is in contact with the side walls of the upper electrode, and the lower surface of the metal frame is in contact with the heterojunction upper layer, the lower surface of the middle bottom of the upper electrode is in contact with the upper surface of the heterojunction upper layer.

2. An infrared-transmitting high-sensitivity visible light detector according to claim 1, characterized in that the thickness of the lower electrode is 2-20 μm; wherein the heavily doped ions are phosphorus ions, boron ions or arsenic ions.

3. An infrared-transmitting high-sensitivity visible light detector according to claim 1, characterized in that the thickness of the heterojunction lower layer is 1-10 μm.

4. An infrared-transmitting high-sensitivity visible light detector according to claim 1, characterized in that the thickness of the heterojunction upper layer is ≤5 nm, which is a nano film composed of two-dimensional materials sensitive to visible light; the two-dimensional material is graphene or two-dimensional transition metal sulfide, and the two-dimensional transition metal sulfide is molybdenum disulfide ($MoS_2$), tungsten disulfide ($WS_2$), molybdenum diselenide ($MoSe_2$) or tungsten diselenide ($WSe_2$).

5. The infrared-transmitting high-sensitivity visible light detector according to claim 1, characterized in that the one-dimensional conductive nanowires are carbon nanotubes or silver nanowires.

6. The infrared-transmitting high-sensitivity visible light detector according to claim 1, characterized in that the passivation layer is any one of zinc sulfide, zinc selenide or magnesium fluoride.

7. The infrared-transmitting high-sensitivity visible light detector according to claim 1, characterized in that a through hole is opened at one corner of the detection unit from the lower surface of the intrinsic monocrystalline silicon substrate up to the upper surface of the heterojunction upper layer; at the opposite corner of the detection unit, an opening is set from the lower surface of the intrinsic monocrystalline silicon substrate up to the inside of the lower electrode; on the lower surface of the intrinsic monocrystalline silicon substrate, the opening positions of the through hole and the opening are located at two corners on the same diagonal of the bottom surface of the detection unit; after the side walls of the through hole and the hole are passivated, the holes are filled with conductive metal, and the conductive metal is any one of gold, silver, copper or aluminum.

8. The infrared-transmitting high-sensitivity visible light detector according to claim 7, characterized in that the upper end opening of the through hole is located at a corner below the metal frame and is in contact with the metal frame; the conductive metal in the through hole and the opening protrudes from the lower surface of the intrinsic monocrystalline silicon substrate.

9. A preparation method of the infrared-transmitting high-sensitivity visible light detector according to claim 8, characterized in that it comprises the following steps:
   Step 1, inject heavily doped ions into an area below 1-10 μm from the upper surface of the intrinsic monocrystalline silicon chip as a lower electrode; the heavily doped ions are phosphorus ions, boron ions or arsenic ions; the thickness of the lower electrode is 2-20 μm; intrinsic monocrystalline silicon above the lower electrode is heterojunction lower layer, and intrinsic monocrystalline silicon below the lower electrode is intrinsic monocrystalline silicon substrate;
   Step 2, deposit a nano film sensitive to visible light and transparent to infrared on the upper surface of the heterojunction lower layer by a chemical vapor deposition method to form a heterojunction upper layer; the nano film material is either graphene or two-dimensional transition metal sulfide; the heterojunction upper layer and the heterojunction lower layer together form a heterojunction;
   Step 3, etch a through hole from the lower surface of the intrinsic monocrystalline silicon substrate up to the upper surface of the heterojunction upper layer at one corner of the detection unit; etch opening from the lower surface of the intrinsic monocrystalline silicon substrate up to the inside of the lower electrode at the opposite corner of the detection unit; passivate and insulate the side walls of the through hole and opening, and then deposit conductive metals so that the conductive metals of the through hole and opening will protrude from the lower surface of the intrinsic monocrystalline silicon substrate; prepare a square annular metal frame on the upper surface of the heterojunction upper layer, and contact and conduct the metal in the through hole;

Step 4, manufacture an upper electrode on the heterojunction upper layer and the upper surface of the metal frame;

Step 5, deposit a passivation layer on the upper electrode, pattern the passivation layer into a probe unit shape by photoetching and etching, and etch the upper electrode, the heterojunction upper layer, the heterojunction lower layer and the lower electrode by using the patterned passivation layer as a masking layer; thus to form an infrared-transmitting high-sensitivity visible light detector.

* * * * *